(12) United States Patent
Hsieh et al.

(10) Patent No.: US 8,091,504 B2
(45) Date of Patent: Jan. 10, 2012

(54) METHOD AND APPARATUS FOR CLEANING SPIN COATER

(75) Inventors: Chun-Jen Hsieh, Taichung (TW);
Chi-Kang Peng, Hsinchu (TW);
Wen-Hao Yang, Hsinchu (TW);
Hung-Tai Tsao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 652 days.

(21) Appl. No.: 11/522,990

(22) Filed: Sep. 19, 2006

(65) Prior Publication Data

US 2008/0066786 A1 Mar. 20, 2008

(51) Int. Cl.
*B05C 11/02* (2006.01)
*B05B 15/04* (2006.01)

(52) U.S. Cl. .......... 118/319; 118/320; 118/326; 118/52; 118/612

(58) Field of Classification Search .......... 118/52, 118/612, 319, 320, 56, 602, 603, 326; 134/153, 134/198, 902; 427/240; 396/604, 611, 627
See application file for complete search history.

(56) References Cited

U.S. PATENT DOCUMENTS

| | | | | |
|---|---|---|---|---|
| 5,608,943 A | * | 3/1997 | Konishi et al. | 15/302 |
| 5,718,763 A | * | 2/1998 | Tateyama et al. | 118/52 |
| 5,965,200 A | * | 10/1999 | Tateyama et al. | 427/240 |
| 6,432,199 B1 | * | 8/2002 | Takekuma | 118/52 |
| 2004/0250839 A1 | * | 12/2004 | Robertson et al. | 134/33 |

FOREIGN PATENT DOCUMENTS

JP 2001332537 A * 11/2001

OTHER PUBLICATIONS

English Translation Abstract of JP 2001332537 A, Nov. 30, 2001.*

* cited by examiner

*Primary Examiner* — Yewebdar Tadesse
(74) *Attorney, Agent, or Firm* — Birch, Stewart, Kolasch & Birch, LLP

(57) ABSTRACT

A method of cleaning a spin coater apparatus is provided. In one embodiment, the method comprises providing a spin coater apparatus having a coater cup comprising a basin with sidewalls, a rotatable platform situated inside the cup adapted for holding and rotating a wafer to be coated, and a solvent dispensing means mounted under the rotatable platform; placing the substrate on the rotatable platform; rotating the rotatable platform; continuously dispensing a cleaning solvent from the solvent dispensing means to rinse the backside of the wafer with the cleaning solvent and to pre-wet an interior surface of the sidewalls; and dispensing a coating material upon the wafer, the substrate mounted on the rotatable platform.

16 Claims, 4 Drawing Sheets

METHOD AND APPARATUS FOR CLEANING SPIN COATER

BACKGROUND

The present invention relates generally to a spin coater track system, and more particularly, to a method and apparatus for cleaning a coating cup of a spin coater for preventing the deposition and accumulation of solidified coating material on an inside surface of the coating cup.

In manufacturing integrated circuits, a lithography process is frequently used for reproducing circuits and structures on a semiconductor substrate. As a first step in a lithography process, a photoresist layer is first coated onto a semiconductor substrate such that an image can be projected and developed thereon. The photoresist material is a liquid that is coated in a very thin layer on top of the substrate. In a conventional process for applying a photoresist coating material to a substrate, a spin coating apparatus is normally used. The spin coating apparatus is a sealed chamber constructed by an upper compartment, a lower compartment and a circular-shaped, rotating platform that has a diameter slightly smaller than the diameter of a semiconductor substrate. The rotating platform is a vacuum chuck since vacuum is applied to the platform for holding the semiconductor substrate securely during a spin coating process. The rotating platform is positioned in the coating machine such that a semiconductor substrate may be placed on top horizontally. During the coating process, the bottom or uncoated surface of a substrate contacts the rotating platform. A suitable vacuum is then applied to the bottom surface of the substrate such that it stays securely on the vacuum chuck even at high rotational speeds. The rotating motion of the vacuum chuck is achieved by a shaft, which is connected to the vacuum chuck and powered by a motor.

In a typical photoresist coating process, a desirable amount of a liquid photoresist material is first applied to a top surface of the substrate from a liquid dispenser that is mounted on a track while the substrate is rotated at a low speed on the vacuum chuck. The photoresist liquid spread radially outward from the center of the semiconductor substrate where it is applied towards the edge of the substrate until the entire top surface of the substrate is covered with a thin layer. Excess photoresist liquid is spun off the rotating wafer during the photoresist coating process. The rotational speed of the vacuum chuck and the amount of the photoresist liquid applied at the center of the substrate can be determined and adjusted prior to and during an application process such that a predetermined, desirable thickness of the photoresist is obtained. The rotational speed of the vacuum chuck is normally increased at the end of the application process to ensure that the entire surface of the substrate is evenly coated with the photoresist material.

A typical process flow chart illustrating a spin coating process 10 is shown in FIG. 1. In this spin coating process, a liquid material is first dispensed in step 12 by depositing a predetermined amount of liquid at or near the center of the wafer. The amount of the liquid can be suitably controlled by adjusting the flow rate through a dispensing nozzle from which the liquid is dispensed. The flow rate can, in turn, be controlled by a pressure existing in a liquid reservoir tank.

The wafer turns on a wafer pedestal at a rotational speed between 2000 and 3000 rpm when the liquid material is dispensed at the center of the wafer. The liquid material is then spun-out in step 14 by centrifugal forces from the center toward the edge of the wafer uniformly over the entire wafer surface. After all the liquid material is spun-out and the edge of the wafer is fully covered, the solvent contained in liquid has at least partially vaporized and form a solid coating on the wafer surface. After the spin-out step 14 is completed, an edge bead rinse process of step 16 is carried out at the edge of the wafer surface, i.e. an area of approximately 2-3 mm from the edge of the wafer, to wash away material deposited at such area. At this stage of the process, the material has mostly solidified and thus the edge bead rinse process is not always effective. After the edge bead rinse step 16, the backside of the wafer is rinsed by a different jet of cleaning solvent to wash away material deposited at the wafer backside and the interior surface of the coating cup. This is shown as step 18 in FIG. 1. However, following the backside rinse procedure, some photoresist material may still remain on the interior surface of the cup. The wafer is then spun-dry in step 20 to complete the coating process.

A typical spin coating apparatus 22 for coating photoresist on a semiconductor substrate is shown in FIG. 2. The spin coating apparatus 22 consists of a coater cup 28 and a rotating platform 30, i.e. a vacuum chuck, positioned at the center of the coater cup 28 for supporting a semiconductor wafer 26 on a top surface 24 of the vacuum chuck 30. The vacuum chuck can be rotated by a shaft 32, which is connected to an electric motor (not shown). The coater cup 28 is provided with a spent photoresist drain pipe 34. The spent photoresist drain pipe 34 is used to drain away photoresist liquid 36 that spun off the substrate during a coating operation.

In the operation of the conventional spin coating apparatus 22 of FIG. 2, the rotating platform 30 is first loaded with a semiconductor wafer 26 on top. A liquid dispenser 18 then approaches the center of the wafer 26 and applies a predetermined amount of a liquid photoresist material to the center of the substrate. The vacuum chuck 30 then spins to spread out the photoresist material to evenly cover the top surface of the wafer 26. Extra photoresist liquid 36 is thrown off the substrate surface and drained away by the drain pipe 34.

In the conventional spin-coating process of FIG. 1 utilizing the apparatus of FIG. 2, the process results in a significant waste of the liquid coating material since a large amount of the liquid coating material is thrown off the wafer surface during wafer spinning. The liquid coating material thrown off the wafer surface adheres to an interior surface of the cup sidewall and thus forming a donut-shaped ring of solidified photoresist material on the interior surface of the sidewall. The solidified photoresist material becomes a major source of particle contamination during subsequent coating processes for the photoresist. Moreover, the solid particles of the photoresist material may also cause a blockage of a drain pipe that is normally located at the bottom wall of the cup for draining away the liquid coating material. It is a difficult task for un-blocking or cleaning the drain pipe to ensure a free flow of the spent photoresist material.

Accordingly, there is a need for a spin coating apparatus for coating a liquid material on a wafer that does not have the drawbacks or shortcomings of the conventional spin-coaters.

SUMMARY

The present invention is directed to a method of cleaning a spin coater apparatus is provided. In one embodiment, the method comprises providing a spin coater apparatus having a coater cup comprising a basin with sidewalls, a rotatable platform situated inside the cup adapted for holding and rotating a wafer to be coated, and a solvent dispensing means mounted under the rotatable platform; placing the substrate on the rotatable platform; rotating the rotatable platform; continuously dispensing a cleaning solvent from the solvent dispensing means to rinse the backside of the wafer with the cleaning solvent and to pre-wet an interior surface of the sidewalls; and dispensing a coating material upon the wafer, the substrate mounted on the rotatable platform.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. Reference will now be made in detail to the present preferred embodiments of the present invention, examples of which are illustrated in the accompanying drawings.

Figure 1:
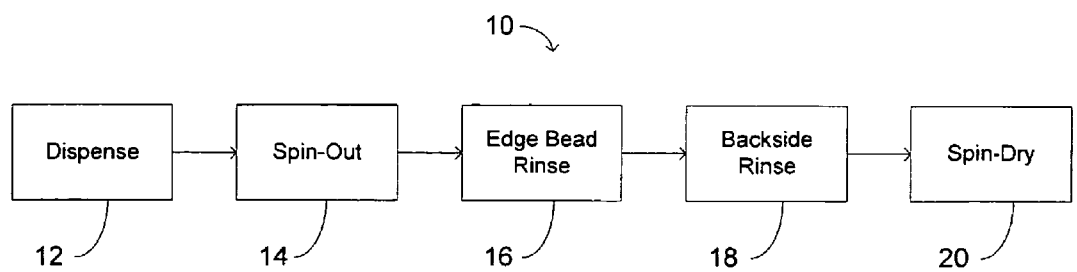
FIG. 1 is a process flow chart for a conventional spin coating process on a wafer.
Figure 2:
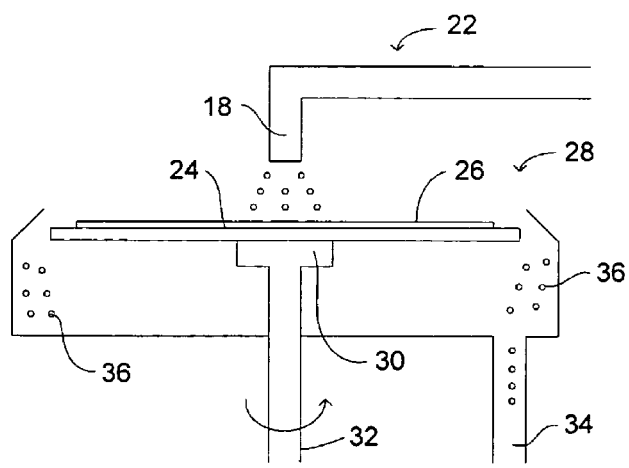
FIG. 2 is a cross-sectional view of a conventional spin coater used in spin coating a liquid on a wafer.
Figure 3:
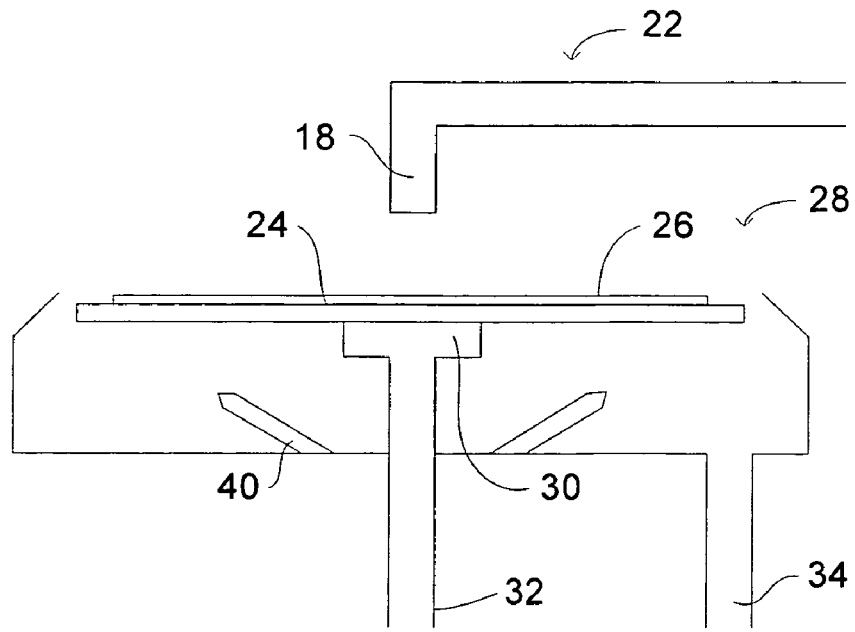
FIG. 3 is a cross-sectional view of a spin coater showing a wafer positioned on a vacuum chuck according to one aspect of the present invention.

The present invention discloses a spin coater that is equipped with a self-cleaning cup and a method for self-cleaning a spin coater. FIG. 3 is a cross-sectional view showing a spin coating apparatus 22 of the present invention. The spin coating cup 28 has a basin with sidewalls and a drain pipe 34 at the bottom of the basin. A rotatable platform 30 is situated inside the cup 28 and is adapted for holding and rotating a wafer 26 to be coated. Wafer 26 is mounted on a top surface 24 of the rotatable platform 30. The rotatable platform 30 may comprise a vacuum chuck. A liquid dispenser 18 is situated over the rotatable platform 30 for dispensing a liquid coating material, such as a photoresist material on top of the wafer 26. The rotatable platform 30 may be rotated at a predetermined speed by a shaft 32, which is connected to an electric motor (not shown). A solvent dispensing means 40 is mounted under the rotatable platform 30 for dispensing a cleaning solvent to pre-wet an interior surface of the sidewalls of the cup 28. In another embodiment, solvent dispensing means 40 may be configured to dispense cleaning solvent onto an interior surface of the sidewalls of the cup 28. Solvent dispensing means 40 may comprise of one or more spray nozzles (two spray nozzles are shown in FIG. 3) for spraying cleaning solvent. The spray nozzles may be fabricated of a material that is chemical resistant, such as stainless steel or Teflon. The nozzle spray(s) may be aimed upwards toward the edge and backside of wafer 26 and the flow rate of the cleaning solvent, such as isopropanol or acetone may flow at a flow rate of between about 2 ml/min and about 20 ml/min. The spray pattern of the cleaning solvent may be fan-shaped such that each nozzle spray may cover a wide area of the interior surface of cup 28. In another embodiment, the solvent dispensing means 40 comprises at least one spray nozzle and a solvent supply tube (not shown) for delivering the cleaning solvent to the spray nozzle. The drain pipe 34 funnels spent cleaning solvent and/or liquid coating material from the bottom of cup 28 to a waste solvent tank (not shown).

Figure 4:
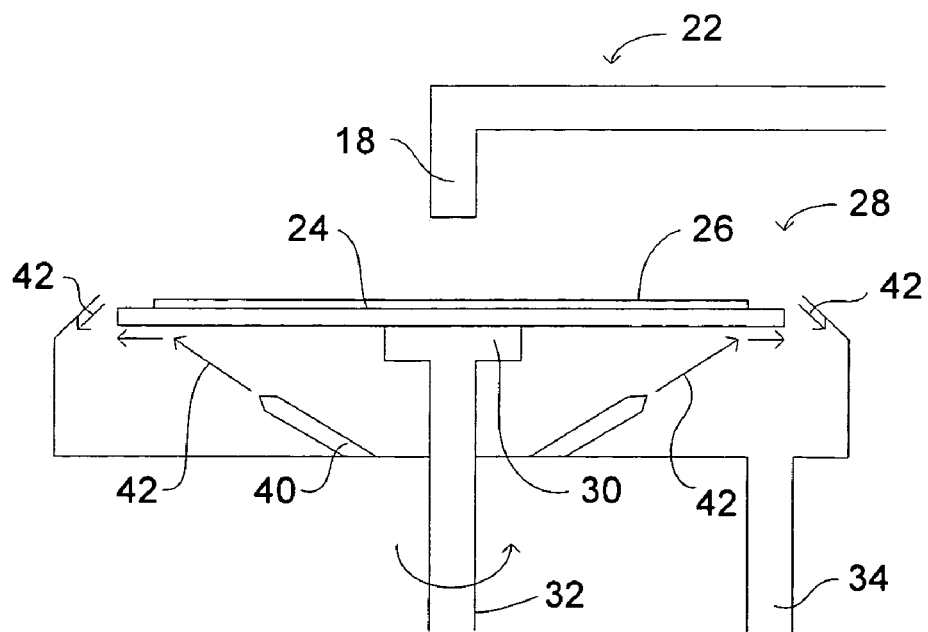
FIG. 4 is a cross-sectional view of the spin coater of FIG. 3 showing steps of rotating the wafer and pre-wetting the inside surface of the cup according to one aspect of the present invention.

The present invention is further directed to a method for self-cleaning a spin coater used for coating a liquid material on a wafer. Referring now to FIG. 4, a cross-sectional view of the spin coater of FIG. 3 shows the steps of rotating the wafer and pre-wetting the inside surface of the cup according to one aspect of the present invention. The solvent dispensing means 40 dispenses a cleaning solvent 42 onto the backside of the wafer 26 to pre-wet an interior surface or side-walls of coater cup 28 to dissolve and rinse off any subsequently dispensed liquid coating material (e.g. photoresist) splattered thereon and to prevent the formation of solid contaminating particles from the splattered liquid coating material.

Figure 5:
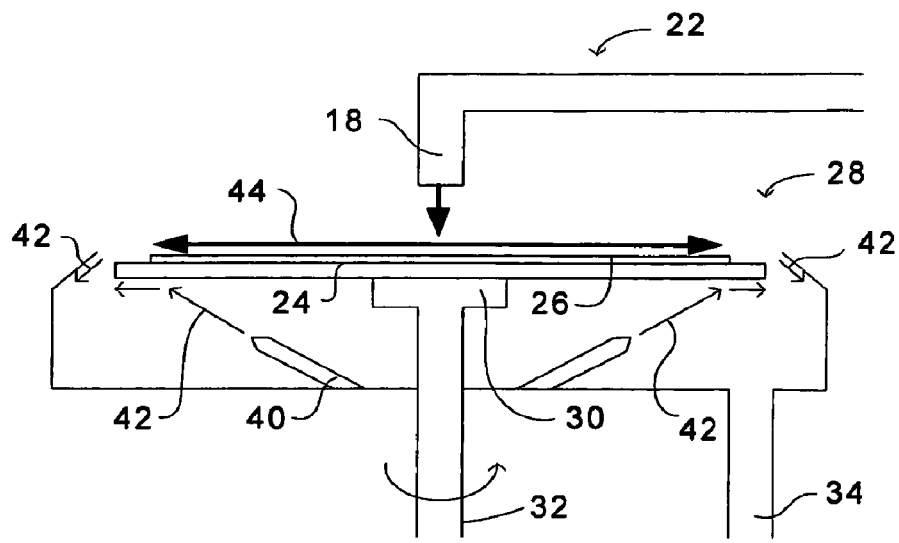
FIG. 5 is a cross-sectional view of the spin coater of FIG. 4 showing a further step of dispensing a liquid material on the wafer according to one aspect of the present invention.

After the steps of rotating the wafer and dispensing cleaning solvent on the wafer backside to pre-wet the sidewalls of the cup, a liquid coating material 44 or photoresist is dispensed by liquid dispenser 18 onto the wafer 26, as shown in FIG. 5.

Figure 6:
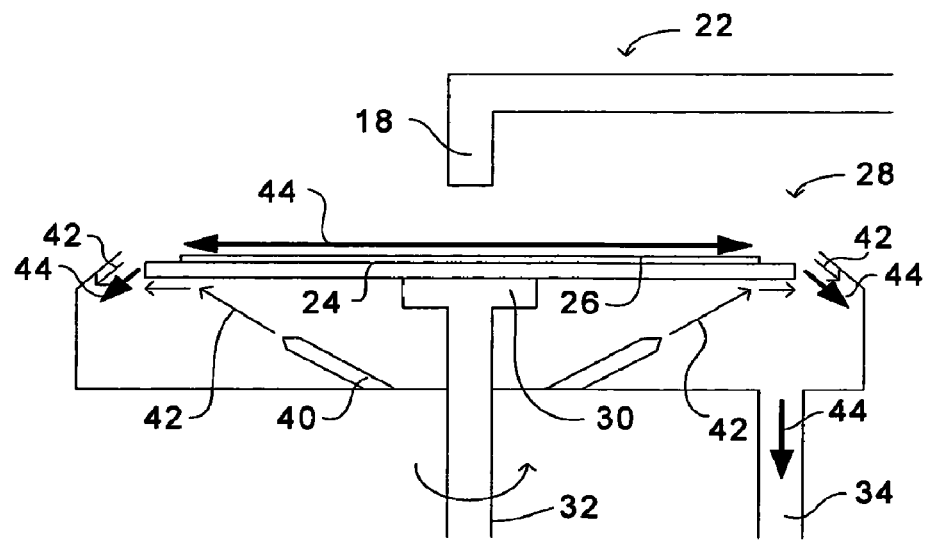
FIG. 6 is a cross-sectional view of the spin coater of FIG. 5 showing some liquid material thrown off the wafer, splashed onto the inside surface of the cup but not adhering thereto, and drained away in drain pipe according to one aspect of the present invention.

FIG. 6 is a cross-sectional view of the spin coater of FIG. 5 showing some liquid coating material 44 thrown off the wafer 26, splashed onto the inside surface of the cup 28 but not adhering thereto, and drained away in drain pipe 34 according to one aspect of the present invention. The liquid coating material 44 does not adhere to the sidewalls of the cup 28 because the cleaning solvent 42 continuously flows down the side-walls of coater cup 28 to rinse off any residual coating material 44 deposited, or splattered thereon.

Figure 7:
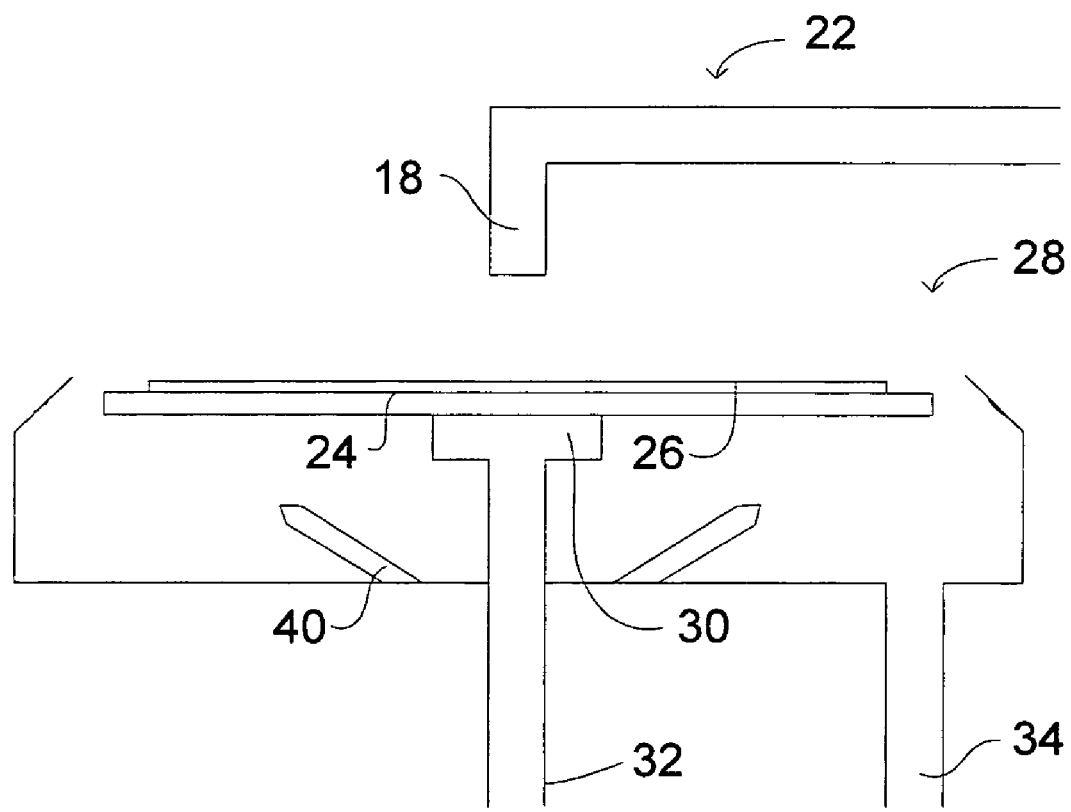
FIG. 7 is a cross-sectional view of the spin coater of FIG. 6 showing little or none of the liquid material remaining on the inside surface of the cup according to one aspect of the present invention.

FIG. 7 is a cross-sectional view of the spin coater of FIG. 6 showing little or none of the liquid coating material 44 remaining on the inside surface of the cup 28 according to one aspect of the present invention.

The present invention described a spin coating apparatus and method thereof, which greatly improves over conventional spin coaters, wherein the coater cups can be easily contaminated by dry photoresist material deposited thereon, thus becoming a major source of solid particle contamination. The dry photoresist material or powder on the sidewalls of the cup further causes blockage of a drain pipe, which may be very difficult and time-consuming to clean. The present invention spin coating apparatus greatly reduces the dry photoresist material remaining on the sidewalls of the cup. As such, the present invention eliminates the need for frequent replacement of the coater cup for cleaning purpose, thereby reducing fabrication costs, cycle time, and improving throughput.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A spin coater apparatus comprising:
a coater cup having a basin with sidewalls and a drain pipe at the bottom of the basin;
a rotatable platform situated inside the cup adapted for holding and rotating a wafer to be coated, wherein the entire bottom surface of the wafer contacts a top surface of the rotatable platform;
a liquid dispenser situated over the rotatable platform for dispensing a liquid coating material on top of the wafer;
motor means for rotating the rotatable platform at a predetermined rotational speed; and
solvent dispensing means mounted under the rotatable platform and extending from the bottom of the basin of the cup with at least a nozzle spray aimed toward edge and backside of the wafer for dispensing a cleaning solvent to pre-wet an interior surface of the sidewalls to dissolve and rinse off any liquid coating material splattered thereon and to prevent the formation of solid contaminating particles from the splattered liquid coating material,
wherein the nozzle spray and the drain pipe are so arranged that substantially the entire interior surface of the sidewalls and the bottom of the basin of the coater cup from which the solvent dispensing means extends are pre-wetted by the cleaning solvent.

2. The spin coater apparatus of claim 1, wherein the solvent dispensing means comprises at least one spray nozzle for spraying the cleaning solvent.

3. The spin coater apparatus of claim 1, wherein the solvent dispensing means comprises at least two spray nozzles for spraying the cleaning solvent.

4. The spin coater apparatus of claim 1, wherein the solvent dispensing means comprises at least one spray nozzle and a solvent supply tube for delivering the cleaning solvent to the spray nozzle.

5. The spin coater apparatus of claim 1, further comprising a waste solvent tank for collecting spent solvent and/or the liquid coating material from the drain pipe.

6. The spin coater apparatus of claim 1, wherein the rotatable platform is a vacuum chuck.

7. The spin coater apparatus of claim 1, wherein the liquid coating material is a photoresist material.

8. A method of cleaning a spin coater apparatus, comprising:
providing the spin coater apparatus of claim 1;
placing the substrate on the rotatable platform;
rotating the rotatable platform;
continuously dispensing the cleaning solvent from the solvent dispensing means to pre-wet an interior surface of the sidewalls; and
dispensing the liquid coating material upon the wafer, the substrate mounted on the rotatable platform.

9. The method of claim 8, further comprising the step of continuously dispensing the cleaning solvent from the solvent dispensing means is after the step of dispensing the liquid coating material upon the wafer.

10. The method of claim 8, wherein the rotatable platform is a vacuum chuck.

11. The method of claim 8, wherein the liquid coating material is a photoresist material.

12. A spin coater apparatus comprising:
a coater cup having a basin with sidewalls and a drain pipe at the bottom of the basin;
a rotatable platform situated inside the cup adapted for holding and rotating a wafer to be coated, wherein the entire bottom surface of the wafer contacts a top surface of the rotatable platform;
a liquid dispenser situated over the rotatable platform for dispensing a liquid coating material on top of the wafer;
motor means for rotating the rotatable platform at a predetermined rotational speed; and
solvent dispensing means mounted under the rotatable platform and extending from the bottom of the basin of the cup with at least a nozzle spray aimed toward edge and backside of the wafer for dispensing a cleaning solvent onto an interior surface of the sidewalls to dissolve and rinse off any liquid coating material splattered thereon and to prevent the formation of solid contaminating particles from the splattered liquid coating material,
wherein the nozzle spray and the drain pipe are so arranged that substantially the entire interior surface of the sidewalls and the bottom of the basin of the coater cup from which the solvent dispensing means extends are pre-wetted by the cleaning solvent.

13. The spin coater apparatus of claim 12, wherein the solvent dispensing means comprises at least one spray nozzle for spraying the cleaning solvent.

14. The spin coater apparatus of claim 12, wherein the solvent dispensing means comprises at least two spray nozzles for spraying the cleaning solvent.

15. The spin coater apparatus of claim 12, wherein the solvent dispensing means comprises at least one spray nozzle and a solvent supply tube for delivering the cleaning solvent to the spray nozzle.

16. The spin coater apparatus of claim 12, further comprising a waste solvent tank for collecting spent solvent and/or the liquid coating material from the drain pipe.

* * * * *